US010796878B2

(12) United States Patent
Hwang

(10) Patent No.: US 10,796,878 B2
(45) Date of Patent: Oct. 6, 2020

(54) REPELLER, CATHODE, CHAMBER WALL AND SLIT MEMBER FOR ION IMPLANTER AND ION GENERATING DEVICES INCLUDING THE SAME

(71) Applicant: VALUE ENGINEERING, LTD., Yongin-si (KR)

(72) Inventor: Kyou Tae Hwang, Seongnam-si (KR)

(73) Assignee: VALUE ENGINEERING, LTD., Yongin-si (KR)

( * ) Notice: Subject to any disclaimer, the term of this patent is extended or adjusted under 35 U.S.C. 154(b) by 0 days.

(21) Appl. No.: 16/583,183

(22) Filed: Sep. 25, 2019

(65) Prior Publication Data

US 2020/0083018 A1  Mar. 12, 2020

Related U.S. Application Data

(62) Division of application No. 15/742,283, filed as application No. PCT/KR2016/006190 on Jun. 10, 2016, now Pat. No. 10,573,486.

(30) Foreign Application Priority Data

Jul. 7, 2015 (KR) .................. 10-2015-0096699
Jul. 7, 2015 (KR) .................. 10-2015-0096700

(Continued)

(51) Int. Cl.
*H01J 37/147* (2006.01)
*H01L 21/265* (2006.01)
(Continued)

(52) U.S. Cl.
CPC .............. *H01J 37/147* (2013.01); *H01J 5/10* (2013.01); *H01J 27/022* (2013.01); *H01J 37/08* (2013.01);
(Continued)

(58) Field of Classification Search
CPC ........ H01J 37/147; H01J 37/30; H01J 37/3002; H01J 37/3171
(Continued)

(56) References Cited

U.S. PATENT DOCUMENTS

2012/0292500 A1* 11/2012 Jones ................... C23C 14/35
250/288
2014/0353518 A1* 12/2014 Sato ..................... H01J 37/08
250/424

* cited by examiner

Primary Examiner — Jason L McCormack
(74) Attorney, Agent, or Firm — STIP Law Group, LLC

(57) ABSTRACT

Provided are elements for an ion implanter and an ion generating device including the same. The elements include a repeller, a cathode, a chamber wall, and a slit member constituting an arc chamber of an ion generating device for ion implantation used in the fabrication of a semiconductor device. A coating structure including a semicarbide layer is provided to each of the elements in order to stabilize the element against thermal deformation, protect the element from wear, and prevent a deposition product from being peeled off. The coating structure enables precise ion implantation without a change in the position of ion generation or distortion of the equipment. The coating structure allows electrons to be uniformly reflected into the arc chamber to increase the uniformity of plasma, resulting in an improvement in the dissociation efficiency of an ion source gas. The coating structure significantly improves the service life of the element compared to those of existing elements. Also provided are ion generating devices including the elements.

12 Claims, 7 Drawing Sheets
(2 of 7 Drawing Sheet(s) Filed in Color)

(30) Foreign Application Priority Data

Jul. 7, 2015 (KR) ........................ 10-2015-0096701
Jul. 7, 2015 (KR) ........................ 10-2015-0096702

(51) Int. Cl.
*H01J 27/02* (2006.01)
*H01J 5/10* (2006.01)
*H01J 37/08* (2006.01)
*H01J 37/09* (2006.01)
*H01J 37/317* (2006.01)

(52) U.S. Cl.
CPC .......... *H01J 37/09* (2013.01); *H01J 37/3171* (2013.01); *H01L 21/265* (2013.01); *H01J 2237/022* (2013.01); *H01J 2237/08* (2013.01); *H01L 21/26513* (2013.01)

(58) Field of Classification Search
USPC .......................... 250/396 R, 423 R, 424, 427
See application file for complete search history.

REPELLER, CATHODE, CHAMBER WALL AND SLIT MEMBER FOR ION IMPLANTER AND ION GENERATING DEVICES INCLUDING THE SAME

CROSS-REFERENCE TO RELATED APPLICATIONS

This application is a Division of application Ser. No. 15/742,283, filed Jan. 5, 2018, which in turn claims the benefit of Korean Patent Application No. 10-2015-0040377, filed Mar. 23, 2015, International Application No. PCT/KR2016/006190 filed on Jun. 10, 2016, which in turn claims the benefit of Korean Application No. 10-2015-0096699, filed on Jul. 7, 2015, Korean Application No. 10-2015-0096700, filed on Jul. 7, 2015, Korean Application No. 10-2015-0096701, filed on Jul. 7, 2015, Korean Application No. 10-2015-0096702, filed on Jul. 7, 2015, the disclosures of which are incorporated by reference into the present application.

BACKGROUND OF THE INVENTION

1. Field of the Invention

The present invention relates to a repeller, a cathode, a chamber wall, and a slit member for an ion implanter and ion generating devices including the same. More specifically, the present invention relates to elements for an ion implanter, such as a repeller, a cathode, a chamber wall, and a slit member constituting an arc chamber of an ion generating device for ion implantation used in the fabrication of a semiconductor device, wherein a coating structure including a semicarbide layer is provided to each of the elements in order to stabilize the element against thermal deformation, protect the element from wear, and prevent a deposition product from being peeled off so that precise ion implantation is enabled without a change in the position of ion generation or distortion of the equipment, electrons can be uniformly reflected into the arc chamber to increase the uniformity of plasma, resulting in an improvement in the dissociation efficiency of an ion source gas, and the service life of the element can be significantly improved compared to those of existing elements, and ion generating devices including the elements.

2. Description of the Related Art

A semiconductor device fabrication method essentially includes two processes: deposition and ion implantation. The deposition process is a process for forming a conductive or insulating film of a semiconductor device. For example, the deposition process is sputtering or chemical vapor deposition. A photo process is carried out to pattern a photosensitive resin through a patterned photomask before etching. The subsequent etching is a process for patterning the underlying conductive or insulating film using the photosensitive resin pattern.

The ion implantation process is a process for controlling the operating characteristics of the electronic device fabricated on a silicon wafer. Conventional ion implantation processes are based on thermal diffusion to dope dopants into films while recent ion implantation processes are based on the penetration of ions with a constant energy into films to dope the films with dopants.

Dopant doping processes based on ion implantation provide better control over the concentration of dopants and are advantageous in controlling or limiting the doping depth of dopants compared to those based on thermal diffusion. Ion implanters for ion implantation include an ion generation unit where ions are generated to doping dopants and an ion analysis unit where the kind and energy of the generated ions are controlled.

In the ion generating device, a filament is heated to emit thermoelectrons, which are accelerated by an electric field to collide with an ion source gas to generate ions. Thermoelectrons can be directly emitted by heating a tungsten filament. The thermoelectrons emitted from the tungsten filament may be accelerated toward a cathode, from which electrons are secondarily emitted. The secondary electron emission can prevent the filament material from degradation, extending the replacement cycle of the element.

The ion source gas introduced into the ion generating device collides with electrons emitted from the cathode and is dissociated. Taking into consideration a high processing temperature ($\geq 1500°$ C.) of an arc chamber, elements constituting the arc chamber are made of refractory metals, such as molybdenum (Mo), W (tungsten), tantalum (Ta), rhenium (Re), and niobium (Nb), as base materials. The chamber is subjected to loading due to its heavy weight and is likely to thermally deform. As a result, the position of ion generation is changed and even the arc chamber is distorted, making it difficult to achieve precise ion implantation.

For example, U.S. Patent Publication No. 2011-0139613 describes a repeller for an ion implanter that is made of tungsten, a kind of refractory metal. This patent publication discloses the use of tungsten or carbon as a material for an electrode body of the repeller but the material is provided merely for structural improvement (e.g., miniaturization) of the repeller and is not associated with quality improvement.

As another example, Korean Patent No. 10-0553716 discloses a front plate for an ion implanter that is made of tungsten. This patent provides a solution to the problem of the increased maintenance and repair cost of the equipment caused by frequent replacement of front plates, achieving good beam uniformity, and proposes a new structure of an element in which a desired shape of the element is made of a particular metal base material that is relatively easy to process and then tungsten is deposited on the surface of the metal base material, which corresponds to the inner side of a chamber body, by coating to form a thin film, achieving good beam uniformity, instead of producing the element using only a refractory metal. However, since the internal temperature of the chamber body increases to or above 900° C. and ions continuously strike the inner wall of the chamber body, the chamber body made of the conductive metal base material is very disadvantageous in dissipating heat and is easily embedded with a dopant, causing contamination or pitting of the inner wall of the chamber body. Particularly, when overheated, the internal materials reach their limits where they can resist, resulting in damage to the element. In this connection, various coating techniques have been proposed but involve the use of expensive coating equipment and precious raw material powders.

In an ion implanter having a slit through which ion beams are emitted, different coefficients of thermal expansion of carbon and a refractory metal material cause thermal deformation with a high load when used in a high-temperature process. As a result, the position of ion emission is changed and the equipment is distorted as a whole, making it impossible to achieve precise ion implantation. Further, peeling occurs at the interface between the carbon layer and the refractory metal coating layer, resulting in the formation of debris particles. Thus, there is a danger that defects will be formed during semiconductor manufacturing and the durability of semiconductor equipment will deteriorate.

There is thus an urgent need to develop a repeller, an electron emitting cathode, a chamber wall, and a slit member by which precise ion implantation is enabled without a change in the position of ion generation or distortion of the equipment, electrons can be uniformly reflected into an arc chamber to increase the uniformity of plasma, resulting in an improvement in the dissociation efficiency of an ion source gas, and the service lives of the elements can be significantly improved compared to those of existing elements, and ion generating devices including the elements.

SUMMARY OF THE INVENTION

Therefore, it is a first object of the present invention to provide a repeller, a cathode, a chamber wall, and a slit member for an ion implanter that are stable against thermal deformation, are protected from wear, and prevent a deposition product from being peeled off despite long-term use of the ion implanter without replacement of the elements.

It is a second object of the present invention to provide ion generating devices including the repeller, the cathode, the chamber wall, and the slit member.

One aspect of the present invention provides a repeller for an ion implanter including: a reflective part placed inside an arc chamber of an ion generating device for the ion implanter and opposite a cathode of the ion generating device; and a terminal part extending from the reflective part and to which a predetermined voltage is applied, wherein the reflective part has a refractory metal material as a base material forming its shape and has a coating structure including a semicarbide layer on at least one surface of the base material.

A further aspect of the present invention provides an electron emitting cathode mounted inside an arc chamber of an ion generating device for an ion implanter and including a lateral portion fixed to one side of the arc chamber and defining a space where a filament is installed and a front portion exposed toward the arc chamber and having a surface from which electrons are emitted wherein the cathode has a refractory metal material as a base material forming its shape and has a coating structure including a semicarbide layer on at least one surface of the base material.

Another aspect of the present invention provides a chamber wall mounted inside an arc chamber of an ion generating device for an ion implanter to define a space where ions are generated wherein the chamber wall covers four sides of the arc chamber and its portion corresponding to at least one of the four sides of the arc chamber has a refractory metal material as a base material forming its shape and has a coating structure including a semicarbide layer on at least one surface of the base material.

Another aspect of the present invention provides a slit member including a slit through which ion beams are emitted from an ion generating device for an ion implanter wherein a slit portion formed with the slit has a refractory metal material as a base material forming its shape and has a coating structure including a semicarbide layer on at least one surface of the base material.

According to one embodiment of the present invention, the coating structure including a semicarbide layer may include a refractory metal carbide structure in which a continuous or discontinuous refractory metal monocarbide layer is layered on a continuous or discontinuous refractory metal semicarbide layer.

According to a further embodiment of the present invention, the coating structure including a semicarbide layer may include a refractory metal carbide structure in which a continuous or discontinuous layer having a hexagonal crystal structure is continuously or discontinuously layered on a continuous or discontinuous layer having at least one crystal structure selected from the group consisting of epsilon ($\varepsilon$-$Fe_2N$ type) crystal structures and beta ($PbO_2$, $Mo_2C$, or $C_6$ type) crystal structures.

According to a further embodiment of the present invention, when the ratio of the weight of the crystal structure constituting the refractory metal monocarbide layer (Wm) to the weight of the crystal structure constituting the refractory metal semicarbide layer (Ws) is defined as X (Wm/Ws), X may be equal to or lower than 5 (where Wm and Ws are determined by multi-phase electron backscatter diffraction (EBSD) analysis).

According to another embodiment of the present invention, the weight of the base material (Ww), the weight of the crystal structure constituting the refractory metal monocarbide layer (Wm), and the weight of the crystal structure constituting the refractory metal semicarbide layer (Ws) may be in a ratio of 90-95:0.8-4:9.2-1 (Ww:Wm:Ws) (where Ww, Wm, and Ws are determined by multi-phase electron backscatter diffraction (EBSD) analysis).

According to another embodiment of the present invention, the semicarbide coating layer may have a minimum thickness of 2 μm and a maximum thickness of 300 μm.

According to another embodiment of the present invention, the terminal part has a refractory metal material as a base material forming its shape and has a coating structure including a semicarbide layer on at least one surface of the base material.

Yet another aspect of the present invention provides an ion generating device including the repeller.

The repeller, the cathode, the chamber wall, and the slit member of the present invention are elements constituting an arc chamber of an ion generating device for ion implantation used in the fabrication of a semiconductor device and a coating structure including a semicarbide layer is provided to each of the elements in order to stabilize the element against thermal deformation, protect the element from wear, and prevent a deposition product from being peeled off so that precise ion implantation is enabled without a change in the position of ion generation or distortion of the equipment, electrons can be uniformly reflected into the arc chamber to increase the uniformity of plasma, resulting in an improvement in the dissociation efficiency of an ion source gas, and the service life of the element can be significantly improved compared to those of existing elements.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and/or other aspects and advantages of the invention will become apparent and more readily appreciated from the following description of the embodiments, taken in conjunction with the accompanying drawings of which.

DETAILED DESCRIPTION OF THE INVENTION

The present invention will now be described in detail with reference to the accompanying drawings.

The present invention is directed to a repeller, a cathode, a chamber wall, and a slit member as elements constituting an arc chamber of an ion generating device for ion implantation in the fabrication of a semiconductor device that has a coating structure including a semicarbide layer wherein a coating structure including a semicarbide layer is provided to each of the elements in order to stabilize the element against thermal deformation, protect the element from wear, and prevent a deposition product from being peeled off so that precise ion implantation is enabled without a change in the position of ion generation or distortion of the equipment, electrons can be uniformly reflected into the arc chamber to increase the uniformity of plasma, resulting in an improvement in the dissociation efficiency of an ion source gas, and the service life of the element can be significantly improved compared to those of existing elements, and ion generating devices including the elements.

Figure 1:
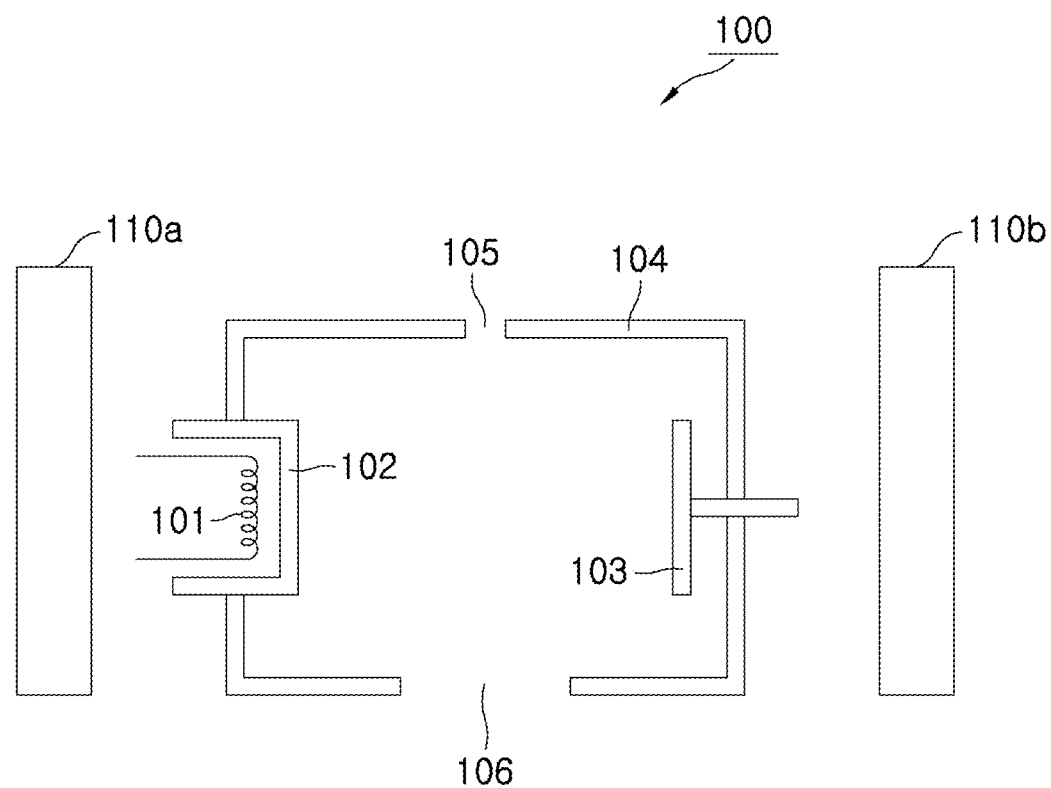
FIG. 1 illustrates the structure of an ion generating device for an ion implanter.

FIG. 1 illustrates the structure of an ion generating device for an ion implanter. Referring to FIG. 1, the ion generating device 100 includes an arc chamber 104 defining a predetermined space, a cathode 102 mounted at one side of the arc chamber, a filament 101 installed in an inner space of the cathode, and a repeller 103 mounted opposite the cathode.

The filament 101 may be made of a high melting point metal like tungsten and functions to emit thermoelectrons to the outside when heated to a predetermined temperature by an electric current flowing from an externally connected power supply. The cathode 102 is spaced a distance from the filament 101. An anode of the external power supply is connected to the cathode to create an electric field between the filament and the cathode. By the electric field, thermoelectrons are emitted from the filament. The thermoelectrons collide with the cathode and electrons are again emitted from the cathode surface. The electrons are emitted toward the space defined by the arc chamber 104. A doping gas and a carrier gas are introduced into the space through a gas inlet 105. A slit member 106 is disposed opposite the gas inlet. The gases and ions and are emitted through the slit member.

A power supply unit is connected to the arc chamber 104 to accelerate the electrons emitted from the cathode 102. The repeller 103 is mounted opposite the cathode 102 at one side of the arc chamber and functions to repel the accelerated electrons emitted from the cathode such that ions are distributed in the limited space. A bias may be applied to the cathode or the electrons may be kept floating. Magnets 110a and 110b may be installed around the arc chamber 104. The magnets may be electromagnets and allow the accelerated moving electrons along the electric field created inside the arc chamber 104 to rotate in the presence of a magnetic field. The rotation of the electrons increases the probability that the electrons will collide with the gas particles, achieving high ionization efficiency. Although illustrated in this figure, an analyzer is installed in the slit member 106 through which ions are emitted. The analyzer accelerates ions in the presence of an electric field and filters particular kinds of ions with a particular energy.

The slit member 106 through which ions are emitted may be disposed on the upper or lower surface of the arc chamber 104 and the gas inlet 105 may be formed opposite the slit member 106.

Figure 2A:
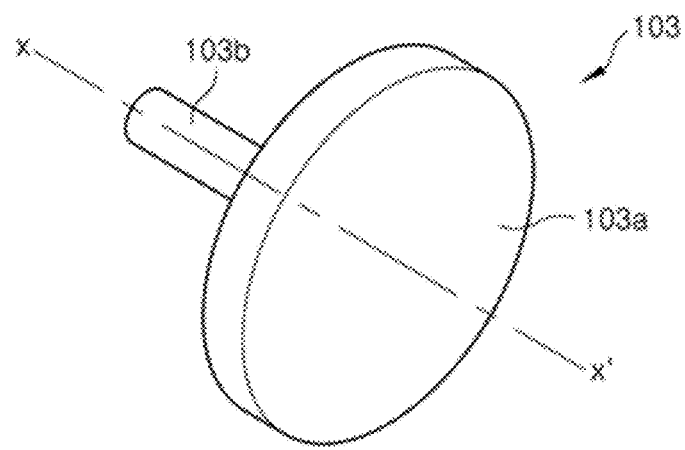
FIGS. 2a and 2b illustrate the structure of a repeller for an ion implanter.
Figure 2B:
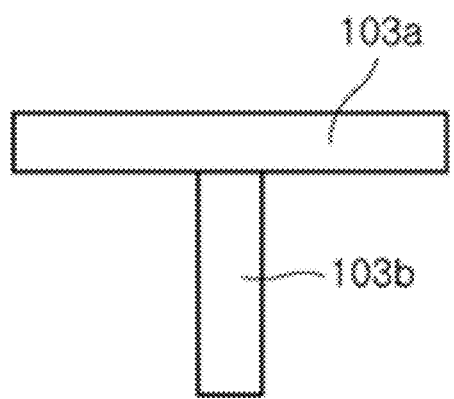

FIG. 2 illustrates the structure of the repeller. Referring to FIG. 2, the repeller 103 includes a reflective part 103a and a terminal part 103b. The reflective part 103a is placed opposite the cathode and may take the form of a plate (e.g., a disc) having a predetermined area and thickness. The terminal part 103b is electrically connected to the reflective part and acts as both a terminal to which a predetermined voltage can be applied and a holder for holding the repeller 103 inside the arc chamber 104.

As described above, the reflective part 103a is placed opposite the cathode in the arc chamber 104 of the ion generating device and the terminal part 103b extends from the reflective part 103a. A predetermined voltage can be applied to the terminal part 103b. The reflective part 103a has a refractory metal material, such as molybdenum (Mo), W (tungsten), tantalum (Ta), rhenium (Re) or niobium (Nb), as a base material forming its shape and has a coating structure including a semicarbide layer on at least one surface of the base material.

Figure 3A:
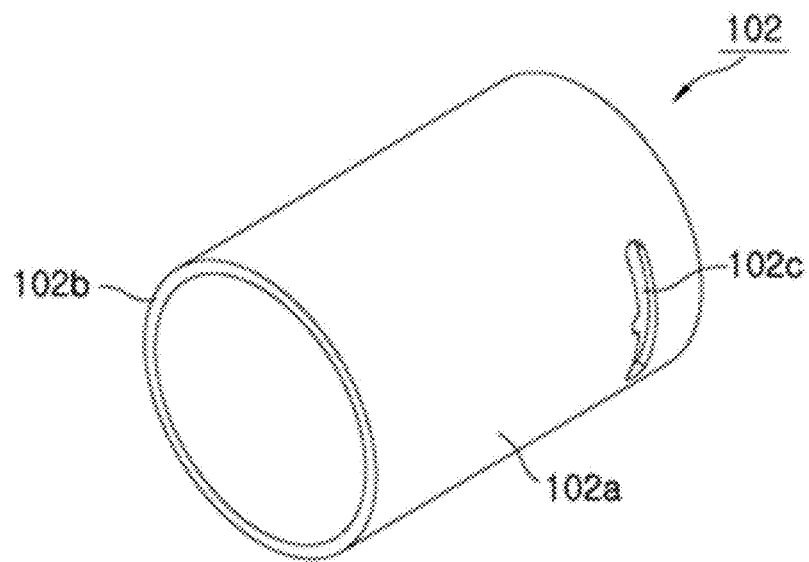
FIGS. 3a and 3b illustrate the structure of an electron emitting cathode for an ion implanter.
Figure 3B:
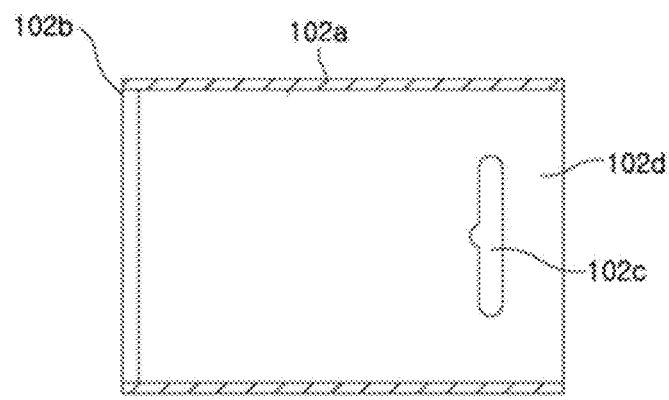

FIG. 3 illustrates the structure of the electron emitting cathode 102. Referring to FIG. 3, the cathode 102 consists of a lateral portion 102a to provide an inner space where the filament 101 can be mounted and a front portion 102b to provide a surface from which electrons are emitted.

The lateral portion 102a may be in the form of a tube having a predetermined length. An inner space 102d and a fastening portion 102c are formed in the cathode 102.

For example, the front portion 102b may have a concave surface and may include a rim, an inwardly slanted portion (not illustrated), and a concave plateau (not illustrated). The rim 102b is formed with a predetermined width at the periphery of the front portion, provides a smooth surface toward the arc chamber, and relatively protrudes toward the arc chamber compared to the concave area. The rim 102b prevents emitted electrons from being focused on one area due to its smooth surface. If the rim is not formed and only the inwardly slanted portion is formed, the outermost portion of the cathode is acutely angled such that electrons are intensively emitted from the rim portion. The inwardly slanted portion is inclined toward the center of the front portion. This inclination increases the area of the cathode surface from which electrons are mitted and allows electrons to be emitted from the slanted surface to the center of the cathode such that the electrons are accelerated toward a region where the doping gas is densified. The inwardly slanted portion is preferably concave toward the arc chamber. This structure is effective in controlling the position of electron emission to maximize the migration of electrons to a region where the doping gas is densified. The concave plateau is formed at the center of the front portion of the cathode and has a smooth surface. The ratio of the width of the inwardly slanted portion to the radius of the concave plateau can be adjusted such that improved ionization efficiency can be achieved. When the front portion is circular, the inwardly slanted portion and the concave plateau have the same center of curvature. In this case, the ratio of the radius of the concave plateau to the width of the inwardly slanted portion may be, for example, in the range of 1:0.5 to 1:1.5. Within this range, effective control over the direction of electron emission is enabled by the slanted portion and improved ionization efficiency can be ensured. The depression depth of the concave plateau may be from 0.5 to 1.5 times the radius of the concave plateau. In this case, the area of the cathode is increased and ionization efficiency can be improved.

As described above, the cathode 102 is mounted inside the arc chamber 104 of the ion generating device, the lateral portion of the cathode 102 is fixed to one side of the arc chamber 104 and defines a space where the filament 101 is installed, and the front portion of the cathode is exposed toward the arc chamber and has a surface from which electrons are emitted. The cathode has a refractory metal material as a base material forming its shape and has a coating structure including a semicarbide layer on at least one surface of the base material.

Figure 4:
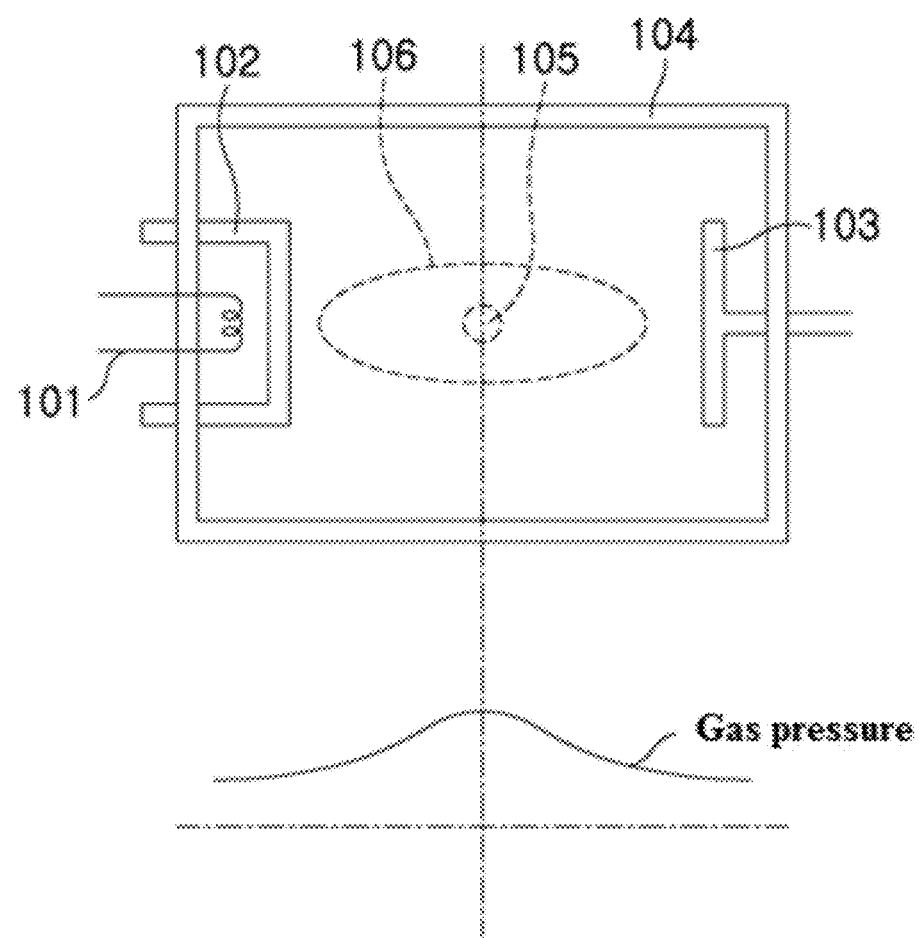
FIG. 4 explains the density distribution of gas in an arc chamber.

FIG. 4 explains the density distribution of gas in the arc chamber. Referring to FIG. 4, a chamber wall 104a is formed in the arc chamber 104. The chamber wall 104a covers four sides of the arc chamber 104. The gas inlet 105 and the slit member 106 through which ions are emitted are also formed in the arc chamber 104. A doping gas and a carrier gas enter through the gas inlet, are partially ionized, and are released through the slit member 106. At this time, a difference in gas pressure arises in the arc chamber 104. Specifically, the gas density (i.e. gas pressure) is high in a region close to the gas inlet 105. That is, the larger the number of electrons accelerated toward a region where the doping gas is densified, the higher the probability of ionization.

The chamber wall 104a is mounted inside the arc chamber to define a space where ions are generated in the ion generating device. The chamber wall portion corresponding to at least one of the four sides of the arc chamber has a refractory metal material as a base material forming its shape and has a coating structure including a semicarbide layer on at least one surface of the base material.

Figure 5:
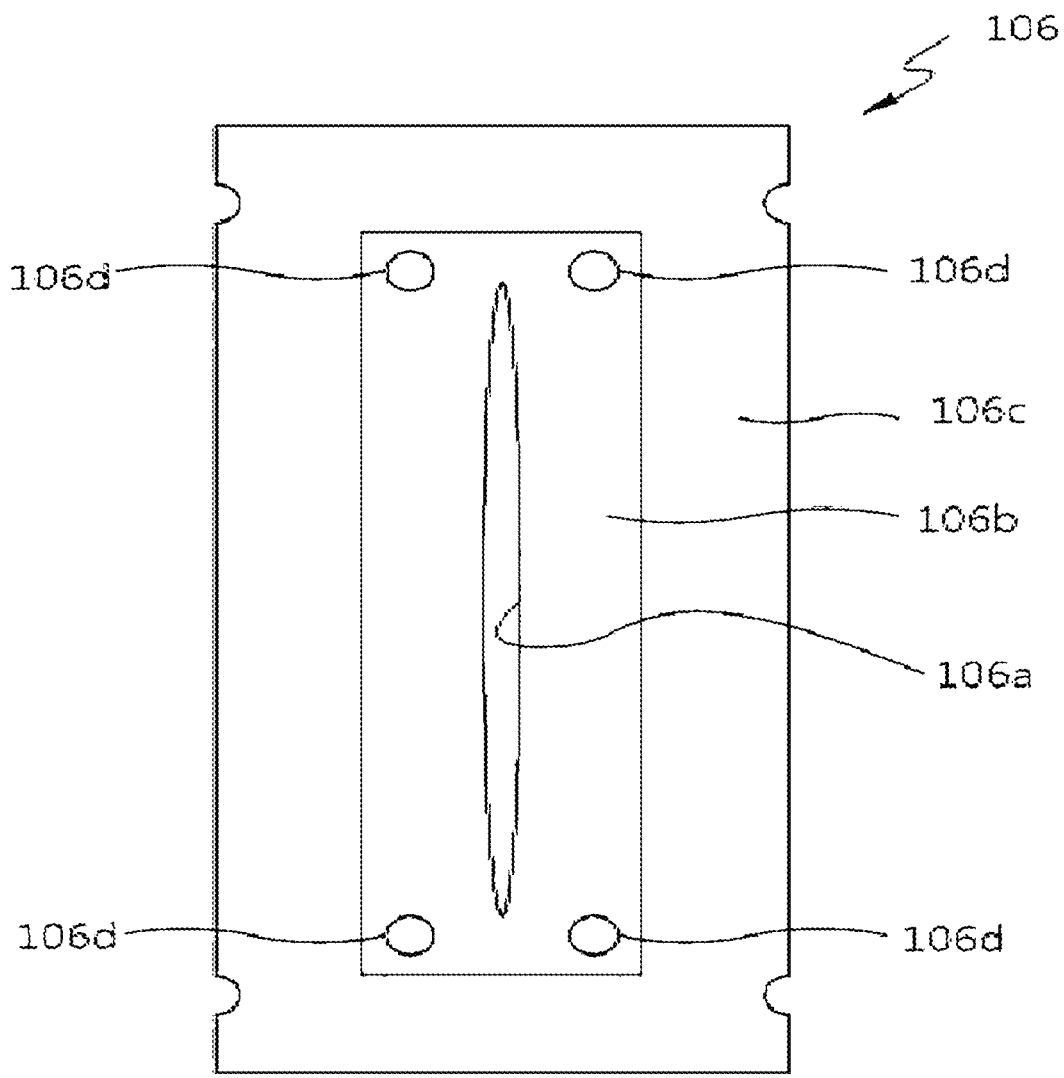
FIG. 5 illustrates the structure of a slit member for an ion implanter.

FIG. 5 illustrates the structure of the slit member. Referring to FIG. 5, the slit member 106 has a slit portion 106b formed with a slit 106a, a frame 106c having a central insertion hole (not illustrated) into which the slit portion 106b is fitted. The slit portion 106b and the frame 106c can be interconnected to each other through connection members 106d. The connection members 106d may be screws. In this case, each of the slit portion 106b and the frame 106c may have a plurality of screw holes (not illustrated) for the insertion of the screws. The slit portion 106b and the frame 106c may be made of the same or different materials.

Ion beams may be emitted from the ion generating device to the outside through the slit of the slit member 106. The slit portion formed with the slit has a refractory metal material as a base material forming its shape and has a coating structure including a semicarbide layer on at least one surface of the base material.

Unless otherwise specified, the term "coating structure including a semicarbide layer" as used herein refers to a structure in which a semicarbide layer is layered as an underlying coating layer. The coating structure including a semicarbide layer provides stability against thermal deformation, wear resistance, and phase stability and prevents a deposition product from being peeled off while avoiding the use of an additive or the formation of a protective/intermediate layer.

For example, the coating structure including a semicarbide layer may have a refractory metal carbide structure in which a continuous or discontinuous refractory metal monocarbide layer is layered on a continuous or discontinuous refractory metal semicarbide layer. This layered structure provides improved stability against thermal deformation and wear resistance and prevents a deposition product from being peeled off compared to a semicarbide or monocarbide monolayer.

As an alternative, the coating structure including a semicarbide layer may have a structure in which a continuous or discontinuous layer having a hexagonal crystal structure is continuously or discontinuously layered on a continuous or discontinuous layer having at least one crystal structure selected from the group consisting of epsilon ($\varepsilon$-$Fe_2N$ type) crystal structures and beta ($PbO_2$, $Mo_2C$, or $C_6$ type) crystal structures. Due to this continuously or discontinuously layered structure of different crystal structures, improved phase stability can be further provided. Here, the bilayer is preferably a structure in which a continuous layer having a hexagonal crystal structure is layered on a continuous layer having an epsilon ($\varepsilon$-$Fe_2N$ type) crystal structure.

When the ratio of the weight of the crystal structure constituting the refractory metal monocarbide layer (Wm) to the weight of the crystal structure constituting the refractory metal semicarbide layer (Ws) is defined as X (Wm/Ws), X may be equal to or lower than 5. When X is not greater than 5, the layered structure provides improved stability against thermal deformation and wear resistance and prevents a deposition product from being peeled off. Here, Wm and Ws are determined by multi-phase electron backscatter diffraction (EBSD) analysis. Specifically, X may be in the range of 0.01 to 5, 0.03 to 4, 0.1 to 4, 0.05 to 0.3, or 0.1 to 0.2.

The weight of the base material (Ww), the weight of the crystal structure constituting the refractory metal monocarbide layer (Wm), and the weight of the crystal structure constituting the refractory metal semicarbide layer (Ws) may be in a ratio of 90-95:0.8-4:9.2-1 (Ww:Wm:Ws). In this ratio, the layered structure provides improved stability against thermal deformation and wear resistance and prevents a deposition product from being peeled off. The weights Ww, Wm, and Ws are determined by multi-phase electron backscatter diffraction (EBSD) analysis. Specifically, the ratio Ww:Wm:Ws may be 91-94:0.8-3:8.2-3.

The continuous layer having a hexagonal crystal structure may have a first peak with a maximum intensity in the range of 35° to 36° and a second peak in the range of 48° to 50°, and a third peak in the range of 31° to 32° (see the inner peaks in FIG. 7), as measured by XRD analysis. The continuous layer having at least one crystal structure selected from the group consisting of epsilon ($\varepsilon$-$Fe_2N$ type) crystal structures and beta ($PbO_2$, $Mo_2C$, or $C_6$ type) crystal structures may have a first peak with a maximum intensity in the range of 69.5° to 70.0°, a second peak in the range of 39.5° to 40.0°, and a third peak in the range of 52.0° to 52.5° (see the bottom peaks in FIG. 7), as measured by XRD analysis.

The semicarbide layer preferably has a minimum thickness of $\geq 2$ μm and a maximum thickness of $\leq 300$ μm or $\leq 200$ μm. Despite its very small thickness, the semicarbide layer provides sufficiently improved stability against thermal deformation, wear resistance, and phase stability and prevents a deposition product from being peeled off. Unless otherwise specified, the terms "minimum thickness" and "maximum thickness" as used herein refer to thicknesses of the thickest and thinnest portions of the layer, respectively. For example, the coating structure including a semicarbide layer may have a structure in which a monocarbide layer having a thickness of 1 to 10 μm is layered on a semicarbide layer having a thickness of 1 to 50 μm. Within these thickness ranges, improved wear resistance can be provided and a deposition product can be prevented from being peeled off. Specifically, the coating structure including a semicarbide layer may have a structure in which a monocarbide layer having a thickness of 1 to 6 μm is layered on a semicarbide layer having a thickness of 1 to 8 μm.

For reference, in the case where one or more elements of the repeller 103, the cathode 102, the chamber wall 104*a*, and the slit member 106 constituting the arc chamber 104 of the ion generating device 100 have a refractory metal material as a base material forming their shapes and have a coating structure including a semicarbide layer on at least one surface of the base material, the other constituent elements of the arc chamber 104 may be made of a refractory metal material as a base material. If needed, the other constituent elements of the arc chamber 104 may be made of a material having a coating structure including a semicarbide layer on at least one surface of the base material or any suitable material known in the art, such as a carbon or carbon/hydrogen compound.

For example, the coating structure including a semicarbide layer may be formed by processing a refractory metal material as a base material into a desired shape and annealing at least one surface of the base material with a carbon-containing material to form a layered coating layer including a semicarbide layer. As an example for the annealing with a carbon-containing material, carburization or chemical vapor deposition may be performed using a graphite sheet or a carbon black powder to form a multilayer coating structure including the semicarbide layer as a lowermost coating layer.

The multilayer coating structure including a semicarbide layer may have a minimum thickness of ≥2 μm and a maximum thickness of ≤300 μm. The annealing with a carbon-containing material is preferably performed under operating conditions where a monocarbide layer having a thickness of 1 to 10 μm can be layered on a semicarbide layer having a thickness of 1 to 30 μm to form a multilayer coating structure. More preferably, the annealing with a carbon-containing material is preferably performed under operating conditions where a monocarbide layer having a thickness of 1 to 6 μm can be layered on a semicarbide layer having a thickness of 1 to 8 μm to form a coating structure. Specifically, the annealing may be performed by heating to a maximum temperature of 1100 to 2200° C. at a heating rate of 1 to 100° C./min under vacuum or in an inert atmosphere for a dwell time of 0 second to 30 hours (here, "0 second" means instantaneous cooling) but is not limited to these temperature/pressure conditions. The annealing conditions may be adjusted within known ranges depending on such factors as the material for the repeller. The chemical vapor deposition may be performed using hydrogen and a hydrogen/carbon compound in a ratio of 70:30 to 99.9:0.1 at a temperature of 900 to 2200° C. and $10^{-2}$ torr to less than 760 torr lower than the ambient pressure for 0 second to 30 hours but is not limited to these temperature/pressure conditions. The chemical vapor deposition conditions may be adjusted within known ranges depending on such factors as the material for the repeller.

For reference, an explanation will be given concerning the deposition of an ion source gas dissociated in the arc chamber on the repeller surface. First, an ion source gas is deposited in some areas. As the deposition proceeds, the deposition films increase in area and meet different deposition films to form a substantially uniform layer. At this time, some of the deposition films may be separated and peeled off. Cracks may occur in the uniform layer, causing some of the deposition films to be peeled off. When the elements for the ion implanter have a refractory metal material as a base material forming their shapes and have a coating structure including a semicarbide layer on at least one surface of the base material, they are effectively prevented from being peeled off.

The coating structure including a semicarbide layer is provided to each of the repeller, the cathode, the chamber wall, and the slit member constituting the arc chamber of the ion generating device for ion implantation used in the fabrication of a semiconductor device in order to stabilize the element against thermal deformation, protect the element from wear, and prevents a deposition product from being peeled off, so that precise ion implantation is enabled without a change in the position of ion generation or distortion of the equipment, electrons can be uniformly reflected into the arc chamber to increase the uniformity of plasma, resulting in an improvement in the dissociation efficiency of an ion source gas, and the service life of the element can be significantly improved compared to those of existing elements.

The foregoing embodiments of the present invention and effects thereof will be explained with reference to the following examples. These examples are merely illustrative and the scope of the invention is not limited thereto.

Example 1-1

An ion generating device for an ion implanter having the structure illustrated in FIG. 1 was constructed. That is, the repeller 103 including the reflective part 103*a* having a circular surface with a radius of 12 mm and the cathode 102 having a circular surface with a radius of 10.85 mm were mounted opposite each other on both sidewalls. The reflective part 103*a* illustrated in FIG. 2 was processed into a desired shape using a tungsten base material. A graphite sheet as a carbon-containing material was placed on the surface corresponding to the inner side of the base material and was annealed by heating to a maximum temperature 1380° C. at a heating rate of 4.5° C./min for a dwell time of 15 hr without the formation of an intermediate/protective layer to form a material having a bilayer coating structure in which a tungsten monocarbide continuous or discontinuous layer was continuously or discontinuously layered on a tungsten semicarbide continuous or discontinuous layer. Then, the material having a bilayer coating structure was processed into a desired shape. The terminal part 103*b* for applying a predetermined voltage to the reflective part 103*a* was processed into a desired shape using a tungsten base material and was integrated with the reflective part 103*a*.

Figure 6A:
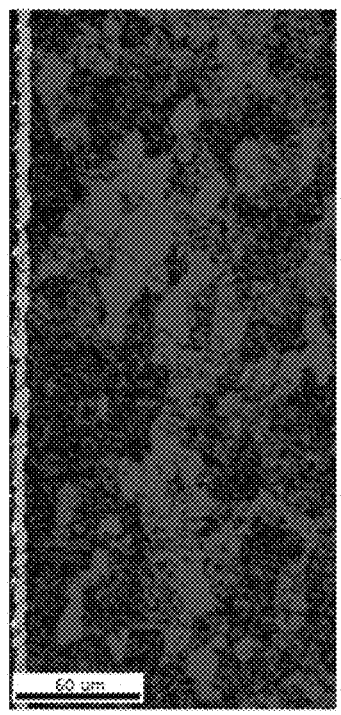
FIGS. 6a and 6b show the surface of a coating structure including a semicarbide layer in which a monocarbide layer was layered on a semicarbide layer formed on the surface of a tungsten base material in Example 1-1, which were analyzed by electron backscatter diffraction (EBSD) using (a) a graphite sheet and (b) a carbon black powder.
Figure 6B:
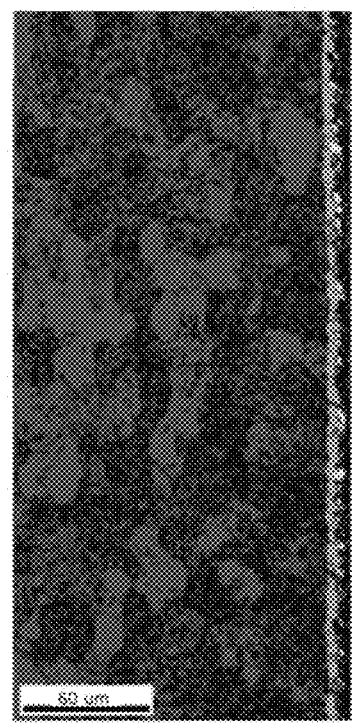

(a) of FIG. 6 shows the surface of the coating structure in which the tungsten monocarbide continuous or discontinuous layer was continuously or discontinuously layered on the tungsten semicarbide continuous or discontinuous layer, which was analyzed by electron backscatter diffraction (EBSD, JEOL, TSL model). As shown in (a) of FIG. 6, the tungsten semicarbide continuous or discontinuous layer was layered on the tungsten layer, wherein the tungsten semicarbide represents by green color, and the tungsten monocarbide continuous or discontinuous layer was continuously or discontinuously layered thereon, wherein the tungsten monocarbide represented by yellow color. As a result of phase separation for surface analysis by EBSD, the coating structure had a multilayer structure in which the monocarbide layer having a thickness of ≤3 μm was layered on the semicarbide layer having a thickness of ≤8 μm. The tungsten semicarbide and the tungsten monocarbide were found to have epsilon (ε-Fe$_2$N type) and hexagonal phase (h-WC) crystal structures, respectively (see FIG. 7).

The proportions of tungsten in the layers were calculated from the results of phase separation using computer software, with the result that the content of tungsten in the tungsten layer (Ww) was 0.913 distribution ratio, the content of tungsten in the crystal structure constituting the tungsten semicarbide layer (Ws) was 0.079 distribution ratio, and the content of tungsten in the crystal structure of the tungsten monocarbide layer (Wm) was 0.008 distribution ratio, from which the ratio of Ww:Wm:Ws was calculated to be 91.3:0.8:7.9.

Figure 7:
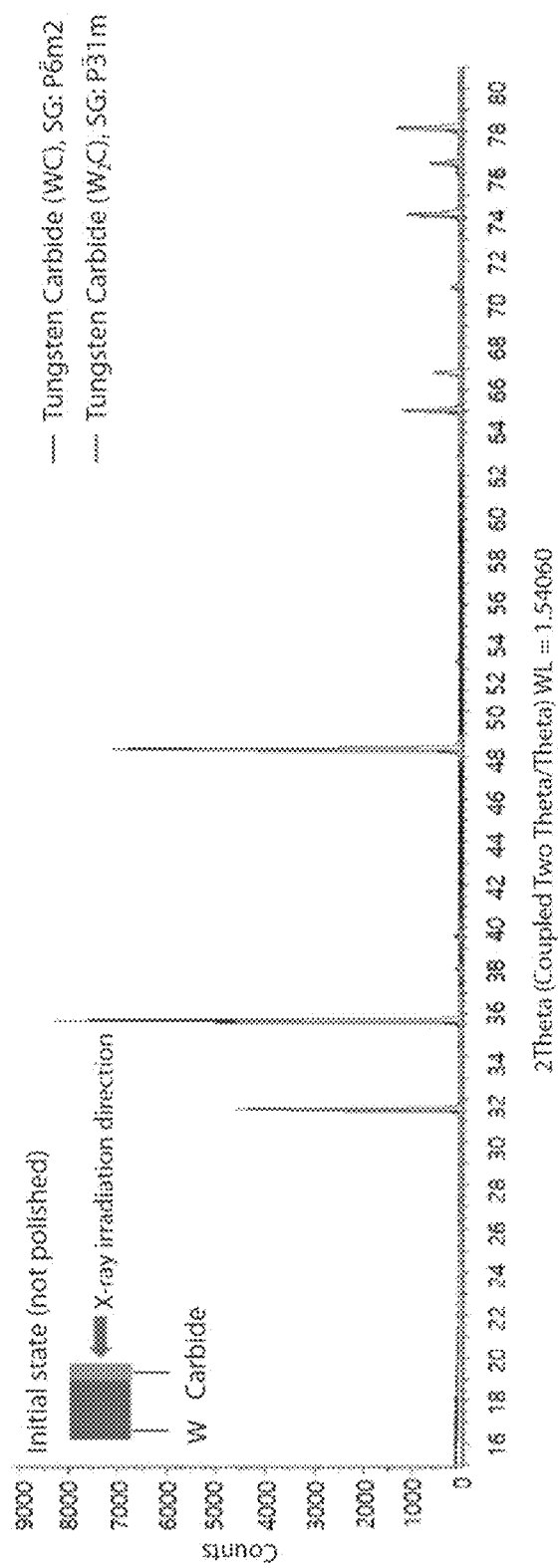
FIG. 7 shows XRD patterns of a coating structure including a semicarbide layer on the surface of a tungsten base material in Example 1-1, indicating the presence of a monocarbide layer layered on a semicarbide layer at an XRD penetration depth of up to 3 μm.

The layered coating structure was analyzed by XRD. The results are shown in FIG. 7. FIG. 7 reveals that the coating structure had a multilayer coating structure in which the continuous or discontinuous layer having a hexagonal crystal structure was continuously or discontinuously layered on the continuous or discontinuous layer having at least one crystal structure selected from the group consisting of epsilon (ε-Fe$_2$N type) crystal structures and beta (PbO$_2$, Mo$_2$C, or C$_6$ type) crystal structures at an XRD penetration depth of up to 3 μm.

Specifically, the tungsten monocarbide continuous or discontinuous layer had a first peak with a maximum intensity in the range of 35° to 36°, a second peak in the range of 48° to 49°, and a third peak in the range of 31° to 32° (see the inner peaks in FIG. 7), as measured by XRD analysis.

No XRD peaks corresponding to tungsten semicarbide were observed in the tungsten semicarbide continuous or discontinuous layer because peaks corresponding to tungsten monocarbide overlapped peaks corresponding to tungsten semicarbide. The tungsten semicarbide continuous or discontinuous layer had a first peak with a maximum intensity in the range of 69.5° to 70.0°, a second peak in the range of 39.5° to 40.0°, and a third peak in the range of 52.0° to 52.5° (see the bottom peaks in FIG. 7), as measured by XRD analysis. The proportions calculated from the results of phase separation for surface analysis by EBSD were applied to factor X (Wm/Ws, hereinafter referred to simply as "X"), which refers to the ratio of the weight of the crystal structure constituting the tungsten monocarbide layer (Wm) and the weight of the crystal structure constituting the tungsten semicarbide layer (Ws). X was calculated to be 0.1 (from 0.008/0.079).

Example 1-2

An ion generating device for an ion implanter having the structure illustrated in FIG. 1 was constructed. That is, the repeller 103 including the reflective part 103a having a circular surface with a radius of 12 mm and the cathode 102 having a circular surface with a radius of 10.85 mm were mounted opposite each other on both sidewalls. The front portion 102b of FIG. 3 was processed into a desired shape using a tungsten base material. A graphite sheet as a carbon-containing material was placed on the surface corresponding to the inner side of the base material and was annealed by heating to a maximum temperature 1380° C. at a heating rate of 4.5° C./min for a dwell time of 15 hr without the formation of an intermediate/protective layer to form a material having a bilayer coating structure in which a tungsten monocarbide continuous or discontinuous layer was continuously or discontinuously layered on a tungsten semicarbide continuous or discontinuous layer. Then, the material having a bilayer coating structure was processed into a desired shape.

Example 1-3

An ion generating device for an ion implanter having the structure illustrated in FIG. 1 was constructed. That is, the repeller 103 including the reflective part 103a having a circular surface with a radius of 12 mm and the cathode 102 having a circular surface with a radius of 10.85 mm were mounted opposite each other on both sidewalls. The chamber wall 104a of FIG. 4 was processed into a desired shape using a tungsten base material. A graphite sheet as a carbon-containing material was placed on the surface corresponding to the inner side of the base material and was annealed by heating to a maximum temperature 1380° C. at a heating rate of 4.5° C./min for a dwell time of 15 hr without the formation of an intermediate/protective layer to form a material having a bilayer coating structure in which a tungsten monocarbide continuous or discontinuous layer was continuously or discontinuously layered on a tungsten semicarbide continuous or discontinuous layer. Then, the material having a bilayer coating structure was processed into a desired shape.

Example 1-4

An ion generating device for an ion implanter having the structure illustrated in FIG. 1 was constructed. That is, the repeller 103 including the reflective part 103a having a circular surface with a radius of 12 mm and the cathode 102 having a circular surface with a radius of 10.85 mm were mounted opposite each other on both sidewalls. The slit portion 106b of FIG. 5 was processed into a desired shape using a tungsten base material. A graphite sheet as a carbon-containing material was placed on the surface corresponding to the inner side of the base material and was annealed by heating to a maximum temperature 1380° C. at a heating rate of 4.5° C./min for a dwell time of 15 hr without the formation of an intermediate/protective layer to form a material having a bilayer coating structure in which a tungsten monocarbide continuous or discontinuous layer was continuously or discontinuously layered on a tungsten semicarbide continuous or discontinuous layer. Then, the material having a bilayer coating structure was processed into a desired shape.

Example 2-1

An ion generating device for an ion implanter having the structure illustrated in FIG. 1 was constructed in the same manner as in Example 1-1, except that the repeller and the cathode having the same radius were used, each of the reflective part 103a and the terminal part 103b of FIG. 2 was processed into a desired shape using a tungsten base material, a carbon black powder as a carbon material was placed on the surface corresponding to the inner side of the base material and was annealed without the formation of an intermediate/protective layer to form a material having a bilayer coating structure in which a tungsten monocarbide continuous or discontinuous layer was continuously or discontinuously layered on a tungsten semicarbide continuous or discontinuous layer, and the material having a bilayer coating structure was processed into a desired shape.

Example 2-2

An ion generating device for an ion implanter having the structure illustrated in FIG. 1 was constructed in the same manner as in Example 1-2, except that the repeller and the cathode having the same radius were used, the front portion 102b of FIG. 3 was processed into a desired shape using a tungsten base material, a carbon black powder as a carbon material was placed on the surface corresponding to the inner side of the base material and was annealed without the formation of an intermediate/protective layer to form a material having a bilayer coating structure in which a tungsten monocarbide continuous or discontinuous layer was continuously or discontinuously layered on a tungsten semicarbide continuous or discontinuous layer, and the material having a bilayer coating structure was processed into a desired shape.

Example 2-3

An ion generating device for an ion implanter having the structure illustrated in FIG. 1 was constructed in the same manner as in Example 1-3, except that the repeller and the cathode having the same radius were used, the chamber wall 104a of FIG. 4 was processed into a desired shape using a tungsten base material, a carbon black powder as a carbon material was placed on the surface corresponding to the inner side of the base material and was annealed without the formation of an intermediate/protective layer to form a material having a bilayer coating structure in which a tungsten monocarbide continuous or discontinuous layer was continuously or discontinuously layered on a tungsten semicarbide continuous or discontinuous layer, and the material having a bilayer coating structure was processed into a desired shape.

Example 2-4

An ion generating device for an ion implanter having the structure illustrated in FIG. 1 was constructed in the same manner as in Example 1-4, except that the repeller and the cathode having the same radius were used, the slit portion 106b of FIG. 5 was processed into a desired shape using a tungsten base material, a carbon black powder as a carbon material was placed on the surface corresponding to the inner side of the base material and was annealed without the formation of an intermediate/protective layer to form a material having a bilayer coating structure in which a tungsten monocarbide continuous or discontinuous layer was continuously or discontinuously layered on a tungsten semicarbide continuous or discontinuous layer, and the material having a bilayer coating structure was processed into a desired shape.

Comparative Example 1-1

An ion generating device for an ion implanter having the structure illustrated in FIG. 1 was constructed in the same manner as in Example 1-1, except that annealing was omitted, and as a result, the reflective part was made of only a tungsten base material without a coating structure including a semicarbide layer (here, factor X defined in Example 1-1 was 0 and the ratio of Ww:Wm:Ws was 100:0:0).

Comparative Example 1-2

An ion generating device for an ion implanter having the structure illustrated in FIG. 1 was constructed in the same manner as in Example 1-2, except that annealing was omitted, and as a result, the front portion was made of only a tungsten base material without a coating structure including a semicarbide layer (here, factor X defined in Example 1-2 was 0 and the ratio of Ww:Wm:Ws was 100:0:0).

Comparative Example 1-3

An ion generating device for an ion implanter having the structure illustrated in FIG. 1 was constructed in the same manner as in Example 1-3, except that annealing was omitted, and as a result, the chamber wall was made of only a tungsten base material without a coating structure including a semicarbide layer (here, factor X defined in Example 1-3 was 0 and the ratio of Ww:Wm:Ws was 100:0:0).

Comparative Example 1-4

An ion generating device for an ion implanter having the structure illustrated in FIG. 1 was constructed in the same manner as in Example 1-4, except that annealing was omitted, and as a result, the slit portion was made of only a tungsten base material without a coating structure including a semicarbide layer (here, factor X defined in Example 1-4 was 0 and the ratio of Ww:Wm:Ws was 100:0:0).

Comparative Example 2-1

An ion generating device for an ion implanter having the structure illustrated in FIG. 1 was constructed in the same manner as in Example 1-1. The coating structure including a semicarbide layer on the reflective part formed in Example 1-1 was subjected to chemical electrolytic polishing or mechanical polishing for surface analysis by electron backscatter diffraction (EBSD) to remove the uppermost tungsten monocarbide layer and expose the tungsten semicarbide layer (here, factor X defined in Example 1-1 was 0). As a result of phase separation for surface analysis by EBSD, the tungsten semicarbide layer was found to have a thickness of ≤10.435 μm.

The proportions of tungsten in the layers were calculated from the results of phase separation using computer software, with the result that the content of tungsten in the tungsten layer (Ww) was 0.879 distribution ratio and the content of tungsten in the crystal structure constituting the tungsten semicarbide layer (Ws) was 0.121 distribution ratio, from which the ratio of Ww:Wm:Ws was calculated to be 87.9:12.1:0.

The tungsten semicarbide was found to have an epsilon ($\varepsilon$-$Fe_2N$ type) crystal structure. No XRD peaks corresponding to tungsten semicarbide were observed in the layer having an epsilon ($\varepsilon$-$Fe_2N$ type) crystal structure because peaks corresponding to tungsten monocarbide overlapped peaks corresponding to tungsten semicarbide. The layer having an epsilon ($\varepsilon$-$Fe_2N$ type) crystal structure had a first peak with a maximum intensity in the range of 69.5° to 70.0°, a second peak in the range of 39.5° to 40.0°, and a third peak in the range of 52.0° to 52.5°, as measured by XRD analysis.

Comparative Example 2-2

An ion generating device for an ion implanter having the structure illustrated in FIG. 1 was constructed in the same manner as in Example 1-2. The coating structure including a semicarbide layer on the front portion formed in Example 1-2 was subjected to chemical electrolytic polishing or mechanical polishing for surface analysis by electron backscatter diffraction (EBSD) to remove the uppermost tungsten monocarbide layer and expose the tungsten semicarbide layer (here, factor X defined in Example 1-2 was 0). As a result of phase separation for surface analysis by EBSD, the tungsten semicarbide layer was found to have a thickness of ≤10.435 μm.

Comparative Example 2-3

An ion generating device for an ion implanter having the structure illustrated in FIG. 1 was constructed in the same manner as in Example 1-3. The coating structure including a semicarbide layer on the chamber wall formed in Example 1-3 was subjected to chemical electrolytic polishing or mechanical polishing for surface analysis by electron backscatter diffraction (EBSD) to remove the uppermost tungsten monocarbide layer and expose the tungsten semicarbide layer (here, factor X defined in Example 1-3 was 0). As a result of phase separation for surface analysis by EBSD, the tungsten semicarbide layer was found to have a thickness of ≤10.435 μm.

Comparative Example 2-4

An ion generating device for an ion implanter having the structure illustrated in FIG. 1 was constructed in the same manner as in Example 1-4. The coating structure including a semicarbide layer on the slit portion formed in Example 1-4 was subjected to chemical electrolytic polishing or mechanical polishing for surface analysis by electron backscatter diffraction (EBSD) to remove the uppermost tungsten monocarbide layer and expose the tungsten semicarbide layer (here, factor X defined in Example 1-4 was 0). As a result of phase separation for surface analysis by EBSD, the tungsten semicarbide layer was found to have a thickness of ≤10.435 μm.

Experimental Example 1-1

Each of the ion generating devices of Examples 1-1 and 2-1 and Comparative Examples 1-1 and 2-2 was operated in an environment using $BF_3$ as an ion source gas to ionize the ion source gas in the arc chamber. The ions escaped through the slit. After the ions were allowed to pass through an extraction electrode and a mass analyzer, the beam intensity was controlled and then the number of the ions was measured using a Faraday system. When the number of the ions to be injected was kept constant, stability against thermal deformation was judged to be "good". When the material for the arc chamber was distorted by thermal deformation, with the result that the number of the ions to be injected was irregular in decreasing and/or increasing cycles, stability against thermal deformation was judged to be "poor".

The cations present in the arc chamber collided with the cathode and/or the repeller and the anions present in the arc chamber collided with the walls of the arc chamber as an anode, causing sputtering by which the surface atoms of the elements migrated. As a result of this sputtering, a deposition product was formed around the inner sides of the arc chamber and fell between the cathode and the anode to connect the two electrodes, causing electrical shorting. A voltage was applied to the arc chamber for 10 min and then the voltage application was stopped for 5 min. This was defined as "one cycle". When electrical shorting occurred, the operation of the ion generating device was stopped. At this time, wear resistance was evaluated by measuring the number of the cycles.

The results obtained for the ion generating devices of Examples 1-1 and 2-1 and Comparative Examples 1-1 and 2-1 are summarized in Table 1.

TABLE 1

| Physical properties | Example 1-1 | Example 2-1 | Comparative Example 1-1 | Comparative Example 2-1 |
| --- | --- | --- | --- | --- |
| Stability against thermal deformation | Good | Good | Good | Good |
| Wear resistance (Number of cycles) | 221 | 244 | 195 | 206 |

As can be seen from the results obtained in Experimental Example 1-1, the ion generating devices of Examples 1-1 and 2-1 had stability against thermal deformation comparable to the ion generating devices of Comparative Examples 1-1 and 2-1. In addition, the ion generating devices of Examples 1-1 and 2-1 showed improved wear resistance compared to the ion generating devices of Comparative Examples 1-1 and 2-1.

Experimental Example 1-2

The results obtained for the ion generating devices of Examples 1-2 and 2-2 and Comparative Examples 1-2 and 2-2 are summarized in Table 2.

TABLE 2

| Physical properties | Example 1-2 | Example 2-2 | Comparative Example 1-2 | Comparative Example 2-2 |
| --- | --- | --- | --- | --- |
| Stability against thermal deformation | Good | Good | Good | Good |
| Wear resistance (Number of cycles) | 223 | 245 | 196 | 207 |

As can be seen from the results obtained in Experimental Example 1-2, the ion generating devices of Examples 1-2 and 2-2 had stability against thermal deformation comparable to the ion generating devices of Comparative Examples 1-2 and 2-2. In addition, the ion generating devices of Examples 1-2 and 2-2 showed improved wear resistance compared to the ion generating devices of Comparative Examples 1-2 and 2-2.

Experimental Example 1-3

The results obtained for the ion generating devices of Examples 1-3 and 2-3 and Comparative Examples 1-3 and 2-3 are summarized in Table 3.

TABLE 3

| Physical properties | Example 1-3 | Example 2-3 | Comparative Example 1-3 | Comparative Example 2-3 |
| --- | --- | --- | --- | --- |
| Stability against thermal deformation | Good | Good | Good | Good |
| Wear resistance (Number of cycles) | 221 | 245 | 196 | 207 |

As can be seen from the results obtained in Experimental Example 1-3, the ion generating devices of Examples 1-3 and 2-3 had stability against thermal deformation comparable to the ion generating devices of Comparative Examples 1-3 and 2-3. In addition, the ion generating devices of Examples 1-3 and 2-3 showed improved wear resistance compared to the ion generating devices of Comparative Examples 1-3 and 2-3.

Experimental Example 1-4

The results obtained for the ion generating devices of Examples 1-4 and 2-4 and Comparative Examples 1-4 and 2-4 are summarized in Table 4.

TABLE 4

| Physical properties | Example 1-4 | Example 2-4 | Comparative Example 1-4 | Comparative Example 2-4 |
|---|---|---|---|---|
| Stability against thermal deformation | Good | Good | Good | Good |
| Wear resistance (Number of cycles) | 222 | 245 | 197 | 208 |

As can be seen from the results obtained in Experimental Example 1-4, the ion generating devices of Examples 1-4 and 2-4 had stability against thermal deformation comparable to the ion generating devices of Comparative Examples 1-4 and 2-4. In addition, the ion generating devices of Examples 1-4 and 2-4 showed improved wear resistance compared to the ion generating devices of Comparative Examples 1-4 and 2-4.

Experimental Example 2-1

During operation of the ion generating devices of Examples 1-1 and 2-1 and Comparative Examples 1-1 and 2-1, the beam currents (mA) were measured to compare the efficiencies of ion generation. In each ion generating device, the arc chamber had a width of 40 mm, a length of 105 mm, and a height of 40 mm, the distance between the arc chamber and the repeller was 85 mm, $BF_3$ was used as an ion source gas, the pressure was 2.5 torr, a voltage of 80 V was supplied to the arc chamber, a current of 160 A was supplied to the filament, and a voltage of 600 V was supplied to the cathode and the repeller.

The results obtained for the ion generating devices of Examples 1-1 and 2-1 and Comparative Examples 1-1 and 2-1 are summarized in Table 5.

TABLE 5

| | Example 1-1 | Example 2-1 | Comparative Example 1-1 | Comparative Example 2-1 |
|---|---|---|---|---|
| Beam current (mA) | 22.1 | 23.2 | 20.0 | 21.2 |

As can be seen from the results in Table 5, the efficiencies of ion generation in the ion generating devices of Examples 1-1 and 2-1 were higher than that in the ion generating device of Comparative Example 1-1. Particularly, the efficiency of ion generation in the ion generating device of Example 2-1 was relatively high.

Experimental Example 2-2

The results obtained for the ion generating devices of Examples 1-2 and 2-2 and Comparative Examples 1-2 and 2-2 are summarized in Table 6.

TABLE 6

| | Example 1-2 | Example 2-2 | Comparative Example 1-2 | Comparative Example 2-2 |
|---|---|---|---|---|
| Beam current (mA) | 22.0 | 23.2 | 20.0 | 21.2 |

As can be seen from the results in Table 6, the efficiencies of ion generation in the ion generating devices of Examples 1-2 and 2-2 were higher than that in the ion generating device of Comparative Example 1-2. Particularly, the efficiency of ion generation in the ion generating device of Example 2-2 was relatively high.

Experimental Example 2-3

The results obtained for the ion generating devices of Examples 1-3 and 2-3 and Comparative Examples 1-3 and 2-3 are summarized in Table 7.

TABLE 7

| | Example 1-3 | Example 2-3 | Comparative Example 1-3 | Comparative Example 2-3 |
|---|---|---|---|---|
| Beam current (mA) | 22.0 | 23.0 | 20.0 | 21.2 |

As can be seen from the results in Table 7, the efficiencies of ion generation in the ion generating devices of Examples 1-3 and 2-3 were higher than that in the ion generating device of Comparative Example 1-3. Particularly, the efficiency of ion generation in the ion generating device of Example 2-3 was relatively high.

Experimental Example 2-4

The results obtained for the ion generating devices of Examples 1-4 and 2-4 and Comparative Examples 1-4 and 2-4 are summarized in Table 8.

TABLE 8

| | Example 1-4 | Example 2-4 | Comparative Example 1-4 | Comparative Example 2-4 |
|---|---|---|---|---|
| Beam current (mA) | 22.0 | 23.1 | 20.0 | 21.3 |

As can be seen from the results in Table 8, the efficiencies of ion generation in the ion generating devices of Examples 1-4 and 2-4 were higher than that in the ion generating device of Comparative Example 1-4. Particularly, the efficiency of ion generation in the ion generating device of Example 2-4 was relatively high.

Although the spirit of the present invention has been described herein with reference to the foregoing embodiments, those skilled in the art will appreciate that various changes and modifications are possible, without departing from the essential features of the present invention. Therefore, the embodiments do not serve to limit the spirit of the invention and are set forth for illustrative purposes. The scope of the invention is defined by the appended claims and all changes or modifications or their equivalents made within the meanings and scope of the claims should be construed as falling within the scope of the invention.

What is claimed is:

1. A chamber wall mounted inside an arc chamber of an ion generating device for an ion implanter to define a space where ions are generated wherein the chamber wall covers four sides of the arc chamber and its portion corresponding to at least one of the four sides of the arc chamber has a refractory metal material as a base material forming its shape and has a coating structure comprising a semicarbide layer on at least one surface of the base material, wherein the coating structure comprising a semicarbide layer comprises a refractory metal carbide structure in which a continuous or discontinuous refractory metal monocarbide layer is layered on a continuous or discontinuous refractory metal semicarbide layer.

2. The chamber wall according to claim 1, wherein the coating structure comprising a semicarbide layer comprises a refractory metal carbide structure in which a continuous or discontinuous layer having a hexagonal crystal structure is continuously or discontinuously layered on a continuous or discontinuous layer having at least one crystal structure selected from the group consisting of epsilon crystal structures and beta crystal structures.

3. The chamber wall according to claim 1, wherein when the ratio of the weight of a crystal structure constituting the refractory metal monocarbide layer (Wm) to the weight of a crystal structure constituting the refractory metal semicarbide layer (Ws) is defined as X (Wm/Ws), X is equal to or lower than 5 (where Wm and Ws are determined by multi-phase electron backscatter diffraction (EBSD) analysis).

4. The chamber wall according to claim 1, wherein the weight of the base material (Ww), the weight of a crystal structure constituting the refractory metal monocarbide layer (Wm), and the weight of a crystal structure constituting the refractory metal semicarbide layer (Ws) are in a ratio of 90-95:0.8-4:9.2-1 (Ww:Wm:Ws) (where Ww, Wm, and Ws are determined by multi-phase electron backscatter diffraction (EBSD) analysis).

5. The chamber wall according to claim 1, wherein the semicarbide coating layer has a minimum thickness of 2 μm and a maximum thickness of 300 μm.

6. An ion generating device comprising the chamber wall according to claim 1.

7. A slit member comprising a slit through which ion beams are emitted from an ion generating device for an ion implanter wherein a slit portion formed with the slit has a refractory metal material as a base material forming its shape and has a coating structure comprising a semicarbide layer on at least one surface of the base material, wherein the coating structure comprising a semicarbide layer comprises a refractory metal carbide structure in which a continuous or discontinuous refractory metal monocarbide layer is layered on a continuous or discontinuous refractory metal semicarbide layer.

8. The slit member according to claim 7, wherein the coating structure comprising a semicarbide layer comprises a refractory metal carbide structure in which a continuous or discontinuous layer having a hexagonal crystal structure is continuously or discontinuously layered on a continuous or discontinuous layer having at least one crystal structure selected from the group consisting of epsilon crystal structures and beta crystal structures.

9. The slit member according to claim 7, wherein when the ratio of the weight of a crystal structure constituting the refractory metal monocarbide layer (Wm) to the weight of a crystal structure constituting the refractory metal semicarbide layer (Ws) is defined as X (Wm/Ws), X is equal to or lower than 5 (where Wm and Ws are determined by multi-phase electron backscatter diffraction (EBSD) analysis).

10. The slit member according to claim 7, wherein the weight of the base material (Ww), the weight of a crystal structure constituting the refractory metal monocarbide layer (Wm), and the weight of a crystal structure constituting the refractory metal semicarbide layer (Ws) are in a ratio of 90-95:0.8-4:9.2-1 (Ww:Wm:Ws) (where Ww, Wm, and Ws are determined by multi-phase electron backscatter diffraction (EBSD) analysis).

11. The slit member according to claim 7, wherein the semicarbide coating layer has a minimum thickness of 2 μm and a maximum thickness of 300 μm.

12. An ion generating device comprising the slit member according to claim 7.

* * * * *